United States Patent [19]

Kuo

[11] Patent Number: 4,775,090
[45] Date of Patent: Oct. 4, 1988

[54] PIN HEAD ASSEMBLY

[76] Inventor: Ming H. Kuo, 7F., No. 239, Sec. 3, Chung Hsiao E. Road, Taipei, Taiwan

[21] Appl. No.: 19,948

[22] Filed: Feb. 27, 1987

[51] Int. Cl.$^4$ .............................................. B25C 7/00
[52] U.S. Cl. ................................... 227/149; 227/156; 29/739
[58] Field of Search .................. 227/147, 149, 156; 29/739, 741, 845

[56] References Cited

U.S. PATENT DOCUMENTS 2,538,895  1/1951  Brennan ........................... 227/149
3,926,356  12/1975  Still ........................... 227/149

Primary Examiner—E. R. Kazenske
Assistant Examiner—James L. Wolfe
Attorney, Agent, or Firm—Morton J. Rosenberg

[57] ABSTRACT

This invention relates to a pin head assembly and in particular to one comprising a stopper having a neck at its inner surface, a hammer disposed within the stopper with the upper end thereof threadedly engaged with a rod of an air cylinder, a body located under the stopper and suspended by two springs with the upper end thereof bearing against the neck of the stopper, a ball mounted into the lower end of the body and a funnel threadedly engaged with one side of the body.

1 Claim, 4 Drawing Sheets

PIN HEAD ASSEMBLY

SUMMARY OF THE INVENTION

This invention relates to a pin head assembly.

It is the primary object of the present invention to provide a pin head assembly which does not need using a hose to connect the pin feeder therewith.

It is another object of the present invention to provide a pin head assembly which utilizes the construction of a large funnel and a small funnel vertically joined together to shorten the length of the hammer and reduce the size of the assembly.

It is still another object of the present invention to provide a pin head assembly which will push the pin partially out of the body before rivetting thereby largely reducing the frictio between the pin and the body.

It is still another object of the present invention to provide a pin head assembly which is efficient in operation.

it is a further object of the present invention to provide a pin head assembly which is inexpensive to manufacture.

The novel features which are characteristic of the invention, together with further objects and advangages thereof will be better understood from the following description considreed in connection with the accompanied drawings and in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE PREFERRED EMBODIMENT

Figure 1:
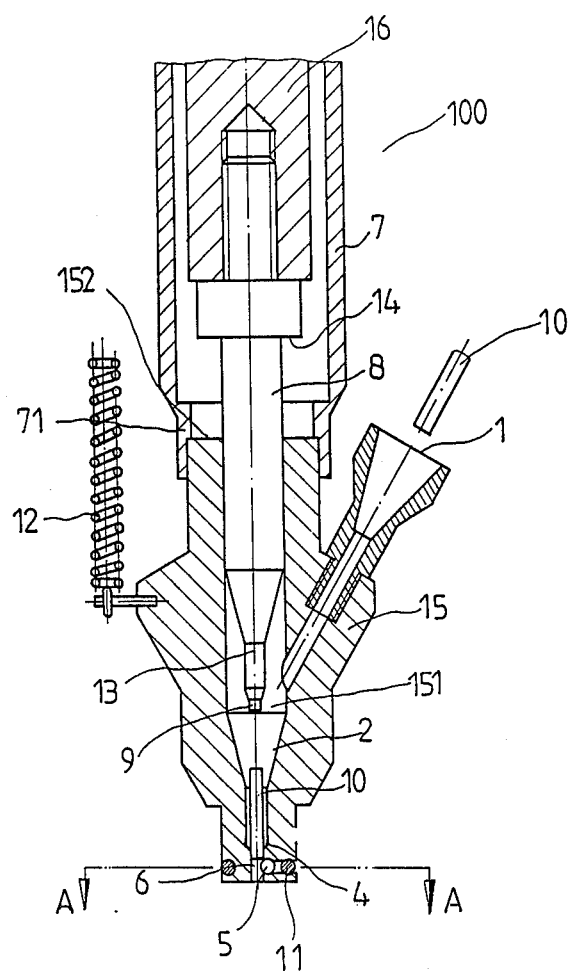
FIG. 1 is a sectional view of a pin head assembly according to the present invention, with a pin located at the exit thereof.

For purposes of promoting an understanding of the principles of the invention, reference will now be made to the embodiment illustrated in the drawings. Specific language will be used to describe same. It will, nevertheless, be understood that no limitation of the scope of the invention is thereby intended, such alternations and further modifications in the illustrated device, and such further applications of the principles of the invention as illustrated herein being comtemplated as would normally occur to one skilled in the art to which the invention relates.

Figure 4:
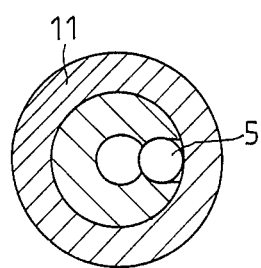
FIG. 4 is a sectional view taken along line A—A of FIG. 1.

Turning now to the drawings wherein like reference characters refer to like and corresponding parts throughout the several views, an embodiment of the pin head assembly according to the present invention is shown in FIG. 1. The pin head assembly 100 mainly comprises a body 15, a hammer 8, a stopper 7 and a funnel 1. The stopper 7 has a neck 71 at its inner surface and rigidly attached to a fixed frame ( not shown). The hammer 8 is disposed within the stopper 7 with its upper end threadedly engaged with a rod 16 of an air cylinder (not shown) thereby enabling the hammer 8 to move therewith. The lower end of the hammer 8 is shaped into a large funnel 13 and a small funnel 9 vertically joined together. The bottom dimeter of the large funnel 13 is just equal to the top diameter of the small funnel 9 while the bottom diameter of the small funnel 9 is equal to the diameter of a pin 10. By means of such construction, the length of the hammer 8 may be greatly shortened thereby increasing the strength of the hammer 8 and reducing the size of the pin head assembly as well. The body 15 is located under the stopper 7 and suspended by two springs 12 (only one spring 12 is shown) conencted at their upper ends with the fixed frame, so that the body 15 is pulled upwards by the springs 12 with the upper end thereof bearing against the neck 71 of the stopper 7. The body 15 is formed with a vertical inner passage 151 the lower end of which is also shaped into a large funnel 2 and a small funnel 4 vertically joined together for just receiving the lower end of the hammer 8. The lower end of the body 15 is provided at the outer surface with a circular groove having a hole in communication with the lower part of the small funnel 4. A steel ball 5 having a large diameter than the hole is disposed therein and kept in position by a resilient ring 11. Hence, part of the steel ball 5 extends into the vertical passage 141 of the body 15 (see FIG. 4). The funnel 1 is threadedly or otherwise engaged with one side of the body 15 and is in communication with the passage 151 of the body 15. The funnel is used to guide a steel pin 10 into the exit 6 of the inner passage 151 of the body 15.

Figure 2:
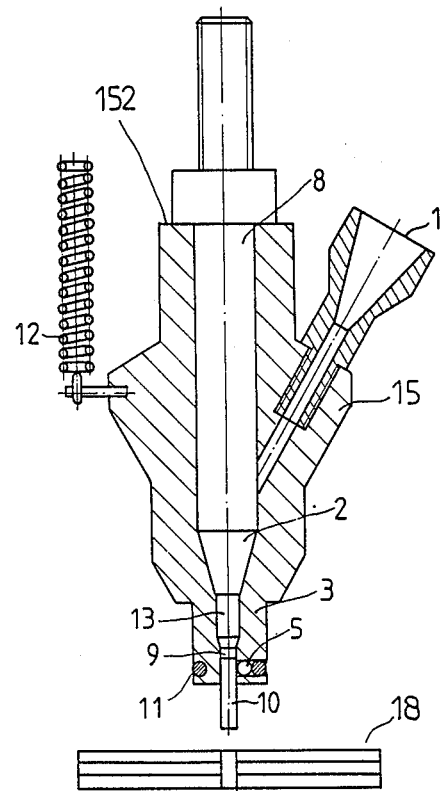
FIG. 2 is a sectional view of the pin head assembly, showing the pin being pressed partially out of the exit thereof.
Figure 3:
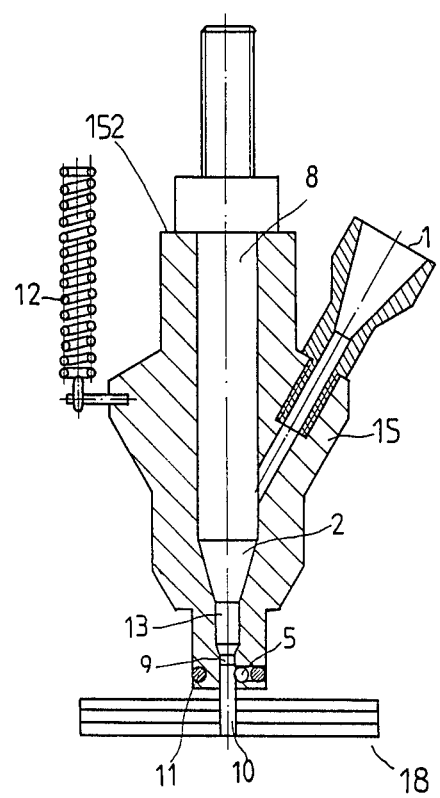
FIG. 3 is a sectional view, showing the pin being pressed down to rivet three printed circuit boards together.

In operation, a pin 10 is first fed into the funnel 1 by a pin feeder (not shown) and slides down to the lower end of the passage 151 of the body 15. When the air cylinder moves downwards, the hammer 8 will also move downwards thereby pushing the pin 10 located at the lower end of the passage 151 of the body 15 partially out of the passage 151 (see FIG. 2). Then, as the hammer 8 further goes downwards, the flange 14 of the hammer 8 will get in touch with the upper end 152 of the body 15 and press down the body 15 to rivet the printed circuit boards 18 with the pin 10. Thereafter, the hammer 8 will move upwards in union with the rod 16 of the air cylincer while the body 15 is pulled upwards to its original position by the springs 12. In the meantime, the pin feeder will feed another pin 10 into the funnel 1 which will lead the pin 10 through the large funel 2 and small funnel 4 into the exit 6 of the passage 151 of the body 15. The pin is then kept in position by the steel ball 5, waiting for next rivetting.

Although this invention has been described with a certain degree of particularity, it is understood that present disclosure is made by way of example only and that numerous changes in the construction and the combination and arrangement of parts may be resorted to without departing from the spirit and scope of the invention as hereinafter claimed.

I claim:

1. A pin head assembly comprising:
    a stopper having a neck at an inner surface thereof and rigidly attached to a fixed frame;
    a hammer disposed within the stopper with an upper end thereof threadedly engaged with a rod of an air cylinder, said hammer having a lower end shaped into a large funnel and a small funnel vertically joined together, said large funnel having a bottom diameter which is equal to a top diameter of the small funnel;

a body located under the stopper and suspended by two springs with an upper end thereof bearing against the neck of the stopper, said body being formed with a vertical inner passage having a shaped adapted to the hammer and a circular groove at a lower end thereof, said groove having a hole in communication of a lower part of the passage of the body;

a ball mounted into the hole and at least partially extending into said lower part of said body passage;

a resilient ring engaged with the circular groove for keeping the ball in position; and an inclined funnel threadedly engaged with one side of the body and being in communication with the passage of the body, whereby a pin is initially fed into the inclined funnel by a pin feeder and slides down to the lower end of the passage of the body and then the hammer is moved downwards by an air cylinder thereby pushing the pin partially out of the passage and when the hammer further goes downwards, the hammer will contiguously interface with the body and press down the body to rivet printed circuit boards with the pin and thereafter, the hammer will move upwards as the air cylinder goes backwards while the body will be pulled upwards by the springs and in the meantime, the pin feeder will feed another pin into the funnel which will lead the pin through the funnel into the lower end of the body where the pin is kept in position by the ball waiting for the next riveting.

* * * * *